US012740294B2

(12) United States Patent
Wang

(10) Patent No.: US 12,740,294 B2

(45) Date of Patent: Sep. 15, 2026

(54) CURVED DISPLAY PANEL, MANUFACTURING METHOD THEREOF, AND DISPLAY DEVICE

(71) Applicants: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

(72) Inventor: Junyuan Wang, Wuhan (CN)

(73) Assignees: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 799 days.

(21) Appl. No.: 17/311,446

(22) PCT Filed: May 18, 2021

(86) PCT No.: PCT/CN2021/094312

§ 371 (c)(1),
(2) Date: Jan. 10, 2024

(87) PCT Pub. No.: WO2022/233070

PCT Pub. Date: Nov. 10, 2022

(65) Prior Publication Data

US 2024/0138237 A1 Apr. 25, 2024
US 2024/0237495 A9 Jul. 11, 2024

(30) Foreign Application Priority Data

May 6, 2021 (CN) ......................... 202110492107.2

(51) Int. Cl.
*H10K 59/80* (2023.01)
*G06F 3/044* (2006.01)
(Continued)

(52) U.S. Cl.
CPC ....... *H10K 59/8731* (2023.02); *G06F 3/0443* (2019.05); *H10K 59/1201* (2023.02);
(Continued)

(58) Field of Classification Search
CPC ........... H10K 59/8731; H10K 59/1201; H10K 59/40; H10K 59/126; H10K 77/111;
(Continued)

(56) References Cited

U.S. PATENT DOCUMENTS

2012/0256202 A1 10/2012 Lee et al.
2017/0062537 A1 3/2017 Kim et al.
2020/0192433 A1* 6/2020 Shin ..................... G06F 1/1652

FOREIGN PATENT DOCUMENTS

CN 101937285 A 1/2011
CN 108400252 A 8/2018
(Continued)

*Primary Examiner* — Anne M Hines
*Assistant Examiner* — Jose M Diaz
(74) *Attorney, Agent, or Firm* — The Roy Gross Law Firm, LLC; Roy D. Gross

(57) ABSTRACT

A curved display panel, a manufacturing method thereof, and a display device are disclosed. The curved display panel includes an encapsulation layer and a touch control functional layer. The encapsulation layer includes a first barrier layer, an organic layer, and a second barrier layer, and the touch control functional layer includes a first interlayer insulating layer, a touch control electrode layer, and a second interlayer insulating layer. At least one of the second barrier (Continued)

layer, the first interlayer insulating layer, or the second interlayer insulating layer is a composite film layer including inorganic sublayers and organic sublayers disposed alternatingly.

20 Claims, 2 Drawing Sheets

(51) Int. Cl.

| | |
|---|---|
| ***H10K 59/12*** | (2023.01) |
| ***H10K 59/40*** | (2023.01) |
| ***H10K 77/10*** | (2023.01) |
| ***H10K 102/00*** | (2023.01) |

(52) U.S. Cl.
CPC .......... *H10K 59/40* (2023.02); *H10K 77/111* (2023.02); *G06F 2203/04102* (2013.01); *G06F 2203/04103* (2013.01); *H10K 2102/311* (2023.02); *H10K 2102/351* (2023.02)

(58) Field of Classification Search
CPC ....... H10K 2102/311; H10K 2102/351; H10K 50/8426; H10K 71/00; G06F 3/0443; G06F 3/041; G06F 3/0412; G06F 2203/04102; G06F 2203/04103
See application file for complete search history.

(56) References Cited

FOREIGN PATENT DOCUMENTS

| | | | |
|---|---|---|---|
| CN | 109004104 | A | 12/2018 |
| CN | 109461830 | A | 3/2019 |
| CN | 109599425 | A | 4/2019 |
| CN | 110246877 | A | 9/2019 |
| CN | 111048530 | A | 4/2020 |
| CN | 111352531 | A | 6/2020 |
| CN | 111768697 | A | 10/2020 |

* cited by examiner

CURVED DISPLAY PANEL, MANUFACTURING METHOD THEREOF, AND DISPLAY DEVICE

CROSS REFERENCE TO RELATED APPLICATIONS

This application is a National Phase of PCT Patent Application No. PCT/CN2021/094312 having International filing date of May 18, 2021, which claims the benefit of priority of Chinese Patent Application No. 202110492107.2, filed May 6, 2021, the contents of which are all incorporated herein by reference in their entirety.

FIELD OF INVENTION

The present disclosure relates to the field of display technologies, and more particularly, to a curved display panel, a manufacturing method thereof, and a display device.

BACKGROUND OF INVENTION

Organic light-emitting diode (OLED) display panels have advantages of self-illumination, fast response times, and wide viewing angles, so they have very broad application prospects. Light-emitting materials of the OLED display panels are very sensitive to water vapor and are very prone to aging after being intruded by the water vapor, thereby shortening a service life of the OLED display panels, so encapsulation layers (thin film encapsulation, TFE) are required for encapsulating the OLED display panels. The encapsulation layers generally adopt organic materials having excellent bending properties and inorganic materials having good water blocking effects, and a path of water intrusion is elongated by alternatingly depositing a three-layered inorganic/organic/inorganic layer. Therefore, the OLED display panels can realize an objective to block water while having flexibility.

With continuous innovations of display technologies, the OLED display panels are developing toward narrow bezels and large screen ratios, so curved display panels have emerged. At present, a manufacturing process of the curved display panels is to manufacture flat display panels first and to use a three-dimensional bonding process to bend edges of the flat display panels after stripping off rigid substrates by laser. However, during the three-dimensional bonding process, inorganic layers away from the light-emitting materials in the encapsulation layers, and first interlayer insulating layers and second interlayer insulating layers in touch control functional layers are farther from a neutral plane, and are generally single-layered silicon nitride structures, so the inorganic layers away from the light-emitting materials, the first interlayer insulating layers, and the second interlayer insulating layers are prone to breaking when bending, thereby causing encapsulation to fail, which seriously affects encapsulation yields. Therefore, it is necessary to improve these defects.

Technical Problem

Technical problem: the inorganic layers away from the light-emitting materials, the first interlayer insulating layers, and the second interlayer insulating layers are prone to breaking when the encapsulation layers and the touch control functional layers of the curved display panels in current technology are in a bending process, thereby causing encapsulation to fail, which seriously affects encapsulation yields. The present disclosure provides a curved display panel, a manufacturing method thereof, and a display device to solve this technical problem.

SUMMARY OF INVENTION

Technical Solution

An embodiment of the present disclosure provides a curved display panel, which includes an encapsulation layer and a touch control functional layer disposed on one side surface of the encapsulation layer; wherein, the encapsulation layer includes a first barrier layer, an organic layer, and a second barrier layer disposed in a stack, and the touch control functional layer includes a first interlayer insulating layer disposed on one side surface of the second barrier layer away from the organic layer, and a touch control electrode layer and a second interlayer insulating layer disposed in a stack on one side surface of the first interlayer insulating layer away from the second barrier layer; and wherein, at least one of the second barrier layer, the first interlayer insulating layer, or the second interlayer insulating layer is a composite film layer including inorganic sublayers and organic sublayers disposed alternatingly.

In the curved display panel provided by an embodiment of the present disclosure, the composite film layer includes N inorganic sublayers and N−1 organic sublayers, and each of the N−1 organic sublayers is disposed between two adjacent inorganic sublayers, wherein, N is an integer greater than 1.

In the curved display panel provided by an embodiment of the present disclosure, the N inorganic sublayers include N−1 first inorganic sublayers disposed in a stack and a second inorganic sublayer disposed on the N−1 first inorganic sublayers, and each of the first inorganic sublayers is defined with a plurality of grooves on one side away from the organic layer.

In the curved display panel provided by an embodiment of the present disclosure, N is an integer greater than 2, and projections of the grooves of two adjacent first inorganic sublayers on the organic layer are staggered from each other.

In the curved display panel provided by an embodiment of the present disclosure, materials of the first barrier layer and the inorganic sublayers are one of silicon nitride, silicon carbonitride, silicon oxynitride, silicon oxide, aluminum oxide, or zinc oxide.

In the curved display panel provided by an embodiment of the present disclosure, materials of the organic layer and the organic sublayers are one of hexamethyldisiloxane, acrylic salts, polyacrylate, polycarbonate, or polystyrene.

In the curved display panel provided by an embodiment of the present disclosure, a thickness of the inorganic sublayers is greater than or equal to 10 nm and is less than 1 μm.

In the curved display panel provided by an embodiment of the present disclosure, a thickness of the organic sublayers is greater than or equal to 10 nm and is less than 1 μm.

In the curved display panel provided by an embodiment of the present disclosure, a thickness of the composite film layer is greater than or equal to 100 nm and is less than or equal to 1 μm.

An embodiment of the present disclosure provides a manufacturing method of a curved display panel. The method includes following steps: step S1: providing a panel body; step S2: forming an encapsulation layer and a touch control functional layer on the panel body in sequence to obtain a flat display panel; and step S3: bending edges of the flat display panel; wherein, the step S2 includes following steps: manufacturing a first barrier layer on the panel body; manufacturing an organic layer on the first barrier layer; manufacturing a second barrier layer on the organic layer; manufacturing a first interlayer insulating layer on the second barrier layer; manufacturing a touch control electrode layer on the first interlayer insulating layer; and manufacturing a second interlayer insulating layer on the touch control electrode layer; wherein, at least one of the second barrier layer, the first interlayer insulating layer, or the second interlayer insulating layer is a composite film layer including inorganic sublayers and organic sublayers disposed alternatingly.

In the manufacturing method of the curved display panel provided by an embodiment of the present disclosure, materials of the first barrier layer and the inorganic sublayers are one of silicon nitride, silicon carbonitride, silicon oxynitride, silicon oxide, aluminum oxide, or zinc oxide.

In the manufacturing method of the curved display panel provided by an embodiment of the present disclosure, materials of the organic layer and the organic sublayers are one of hexamethyldisiloxane, acrylic salts, polyacrylate, polycarbonate, or polystyrene.

In the manufacturing method of the curved display panel provided by an embodiment of the present disclosure, a thickness of the inorganic sublayers is greater than or equal to 10 nm and is less than 1 μm.

In the manufacturing method of the curved display panel provided by an embodiment of the present disclosure, a thickness of the organic sublayers is greater than or equal to 10 nm and is less than 1 μm.

In the manufacturing method of the curved display panel provided by an embodiment of the present disclosure, a thickness of the composite film layer is greater than or equal to 100 nm and is less than or equal to 1 μm.

An embodiment of the present disclosure further provides a display device, which includes a curved display panel and a coverplate disposed on the curved display panel; wherein, the curved display panel includes an encapsulation layer and a touch control functional layer disposed on one side surface of the encapsulation layer; the encapsulation layer includes a first barrier layer, an organic layer, and a second barrier layer disposed in a stack, and the touch control functional layer includes a first interlayer insulating layer disposed on one side surface of the second barrier layer away from the organic layer, and a touch control electrode layer and a second interlayer insulating layer disposed in a stack on one side surface of the first interlayer insulating layer away from the second barrier layer; and at least one of the second barrier layer, the first interlayer insulating layer, or the second interlayer insulating layer is a composite film layer including inorganic sublayers and organic sublayers disposed alternatingly.

In the display device provided by an embodiment of the present disclosure, materials of the first barrier layer and the inorganic sublayers are one of silicon nitride, silicon carbonitride, silicon oxynitride, silicon oxide, aluminum oxide, or zinc oxide.

In the display device provided by an embodiment of the present disclosure, materials of the organic layer and the organic sublayers are one of hexamethyldisiloxane, acrylic salts, polyacrylate, polycarbonate, or polystyrene.

In the display device provided by an embodiment of the present disclosure, a thickness of the inorganic sublayers is greater than or equal to 10 nm and is less than 1 μm.

In the display device provided by an embodiment of the present disclosure, a thickness of the organic sublayers is greater than or equal to 10 nm and is less than 1 μm.

Advantageous Effect

Beneficial effect: the curved display panel provided by the present disclosure includes the encapsulation layer and the touch control functional layer disposed on the side surface of the encapsulation layer. The encapsulation layer includes the first barrier layer, the organic layer, and the second barrier layer disposed in the stack, and the touch control functional layer includes the first interlayer insulating layer disposed on the side surface of the second barrier layer away from the organic layer, and the touch control electrode layer and the second interlayer insulating layer disposed in the stack on the side surface of the first interlayer insulating layer away from the second barrier layer. Wherein, at least one of the second barrier layer, the first interlayer insulating layer, or the second interlayer insulating layer is the composite film layer including the inorganic sublayers and the organic sublayers disposed alternatingly. The present disclosure replaces at least one of the second barrier layer, the first interlayer insulating layer, or the second interlayer insulating layer with the composite film layer that is formed by alternatingly depositing heterogeneous films. In one aspect, the organic sublayers can fill pores and holes of the inorganic sublayers to improve water blocking properties. In another aspect, during a three-dimensional bonding process, since the composite film layer is formed by alternatingly depositing the heterogeneous films, when a topmost inorganic sublayer is broken, the organic sublayers can prevent cracks from extending, and the cracks will not extend to a lowest inorganic sublayer. Therefore, encapsulation failure caused by breakage of inorganic layers can be prevented, thereby improving product yields.

DETAILED DESCRIPTION OF PREFERRED EMBODIMENTS

Embodiments of the Invention

Figure 1:
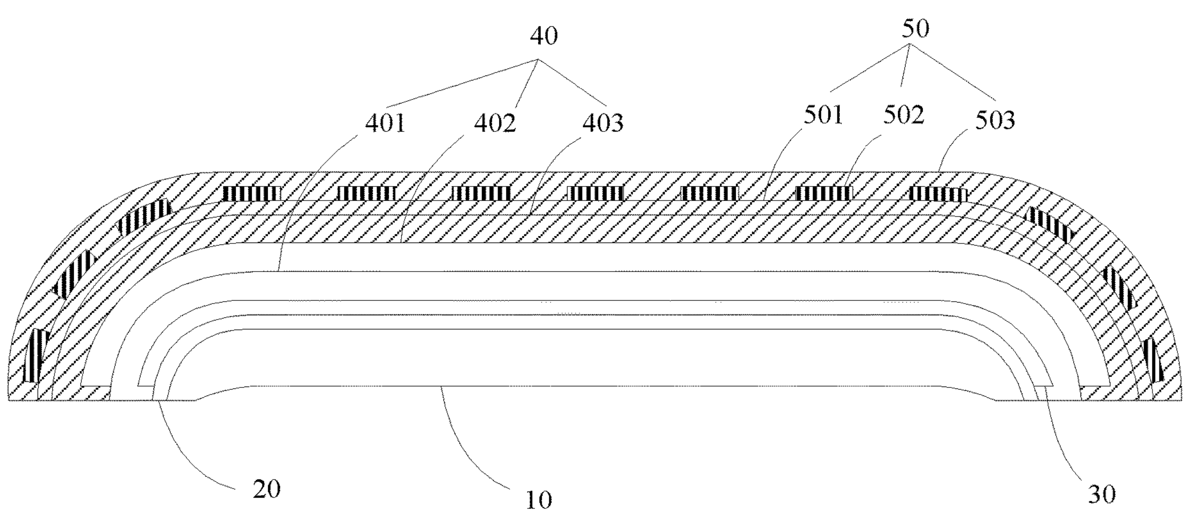
FIG. 1 is a basic schematic structural diagram of a curved display panel according to an embodiment of the present disclosure.

In order to make the purpose, technical solutions, and effects of the present disclosure clearer and more definite, the following further describes the present disclosure in detail with reference to the drawings and embodiments. In the drawings, for clarity, ease of understanding, and description, the sizes and thicknesses of the components shown in the drawings are not to scale.

Figure 2:
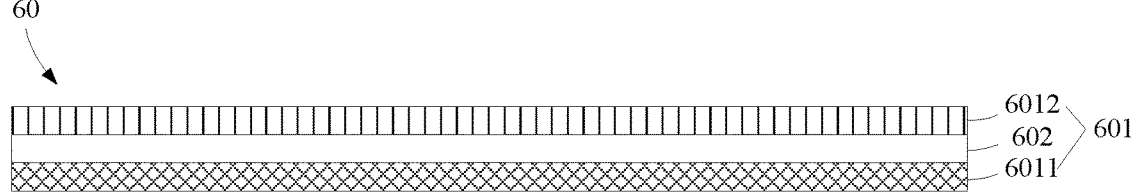
FIG. 2 is a schematic planar structural diagram of a composite film layer according to an embodiment of the present disclosure.

As shown in FIGS. 1 and 2, FIG. 1 is a basic schematic structural diagram of a curved display panel according to an embodiment of the present disclosure, and FIG. 2 is a schematic planar structural diagram of a composite film layer according to an embodiment of the present disclosure. The curved display panel includes an encapsulation layer 40 and a touch control functional layer 50 disposed on one side surface of the encapsulation layer 40. The encapsulation layer 40 includes a first barrier layer 401, an organic layer 402, and a second barrier layer 403 disposed in a stack, and the touch control functional layer 50 includes a first interlayer insulating layer 501 disposed on one side surface of the second barrier layer 403 away from the organic layer 402, and a touch control electrode layer 502 and a second interlayer insulating layer 503 disposed in a stack on one side surface of the first interlayer insulating layer 501 away from the second barrier layer 403. Wherein, at least one of the second barrier layer 403, the first interlayer insulating layer 501, or the second interlayer insulating layer 503 is a composite film layer 60 including inorganic sublayers 601 and organic sublayers 602 disposed alternatingly.

It should be noted that the curved display panel is manufactured by bending edges of a flat display panel, and a three-layered inorganic-organic-inorganic film layer structure is generally used to encapsulate the flat display panel in current technology. Wherein, an outermost inorganic layer is farther from a neutral plane, so it is prone to breaking when in a bending process, thereby causing encapsulation to fail, which seriously affects encapsulation yields. The first interlayer insulating layer and the second interlayer insulating layer in the touch control functional layer on the encapsulation layer are also farther from the neutral plane, thereby being prone to breaking and affecting product yields. This embodiment of the present disclosure replaces at least one of the second barrier layer 403, the first interlayer insulating layer 501, or the second interlayer insulating layer 503 with the composite film layer that is formed by alternatingly depositing heterogeneous films. Wherein, the composite film layer 60 includes the inorganic sublayers 601 and the organic sublayers 602 disposed alternatingly. In one aspect, the organic sublayers 602 can fill pores and holes of the inorganic sublayers 601 to improve water blocking properties. In another aspect, in the bending process, since the composite film layer 60 is formed by alternatingly depositing the heterogeneous films, when a topmost inorganic sublayer 6012 is broken, the organic sublayers 602 can prevent cracks from extending, and the cracks will not extend to a lowest inorganic sublayer 6011. Therefore, encapsulation failure caused by breakage of inorganic layers can be prevented, thereby improving the product yields.

It should be noted that the composite film layer 60 includes N inorganic sublayers 601 and N−1 organic sublayers 602, and each of the N−1 organic sublayers 602 is disposed between two adjacent inorganic sublayers 601, wherein, N is an integer greater than 1. Wherein, FIG. 2 only demonstrates two inorganic sublayers 601 and one organic sublayer 602. When the composite film layer 60 includes a plurality of organic sublayers 602, the composite film layer 60 is still formed by alternatingly depositing the inorganic sublayers 601 and the organic sublayers 602 in sequence from bottom to top according to an order of one inorganic sublayer 601, one organic sublayer 602, another one inorganic sublayer 601, another one organic sublayer 602, etc.

In an embodiment, the curved display panel further includes a substrate 10, a thin film transistor array layer 20 disposed on the substrate 10, and a light-emitting functional layer 30 disposed on the thin film transistor array layer 20, and the light-emitting functional layer 30 is disposed on one side surface of the first barrier layer 401 away from the organic layer 402. Wherein, the substrate 10 may be a rigid substrate or a flexible substrate. If the substrate 10 is the rigid substrate, the substrate 10 needs to be peeled by laser before bending, and if the substrate 10 is the flexible substrate, there is no need to be peeled. The thin film transistor array layer 20 includes a plurality of thin film transistors and is configured to drive the light-emitting functional layer 30 to work. The light-emitting functional layer 30 includes an anode, an organic light-emitting layer, and a cathode. Wherein, the anode provides holes, the cathode provides electrons, and the holes and the electrons are composited in the organic light-emitting layer to emit light for displaying corresponding pictures.

In an embodiment, materials of the first barrier layer 401 and the inorganic sublayers 601 are one of silicon nitride, silicon carbonitride, silicon oxynitride, silicon oxide, aluminum oxide, or zinc oxide. Materials of the organic layer 402 and the organic sublayers 602 are one of hexamethyldisiloxane, acrylic salts, polyacrylate, polycarbonate, or polystyrene.

In an embodiment, a thickness of the inorganic sublayers 601 is greater than or equal to 10 nm and is less than 1 μm. A thickness of the organic sublayers 602 is greater than or equal to 10 nm and is less than 1 μm.

In an embodiment, a thickness of the composite film layer 60 is greater than or equal to 100 nm and is less than or equal to 1 μm.

In an embodiment, the touch control electrode layer 502 may directly be disposed on the second barrier layer 403, that is, the first interlayer insulating layer 501 is omitted, thereby reducing a thickness of the curved display panel, reducing one manufacturing process, and saving production costs.

Figure 3:
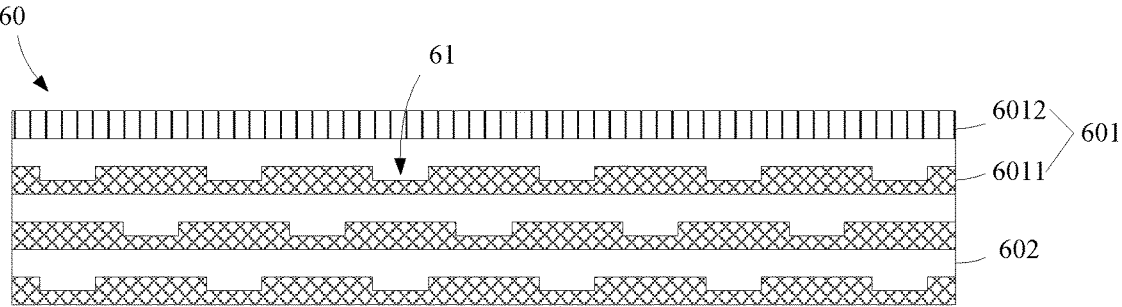
FIG. 3 is a schematic planar structural diagram of another composite film layer according to an embodiment of the present disclosure.

Next, referring to FIG. 3, FIG. 3 is a schematic planar structural diagram of another composite film layer according to an embodiment of the present disclosure. The composite film layer 60 includes the N inorganic sublayers 601 and the N−1 organic sublayers 602, and each of the N−1 organic sublayers 602 is disposed between the two adjacent inorganic sublayers 601, wherein, N is the integer greater than 1. Wherein, the N inorganic sublayers 60 include N−1 first inorganic sublayers 6011 disposed in a stack and a second inorganic sublayer 6012 disposed on the N−1 first inorganic sublayers 6011, and each of the first inorganic sublayers 6011 is defined with a plurality of grooves 61 on one side away from the organic layer 402 (as shown in FIG. 1).

It can be understood that this embodiment of the present disclosure increases a contact area between the first inorganic sublayers 6011 and the organic sublayers 602 by defining the grooves 61 between the first inorganic sublayers 6011 and the organic sublayers 602, thereby improving adhesion to the organic sublayers 602 and relieving bending stresses.

In an embodiment, N is an integer greater than 2, and projections of the grooves 61 of two adjacent first inorganic sublayers 6011 on the organic layer 402 are staggered from each other.

It can be understood that this embodiment can balance the bending stresses of whole composite film layer 60 by staggering the grooves 61 of the two adjacent first inorganic sublayers 6011 from each other, thereby preventing uneven stresses caused by different thicknesses in an area having the grooves 61 and in an area having no grooves 61 in one layer.

Figure 4:
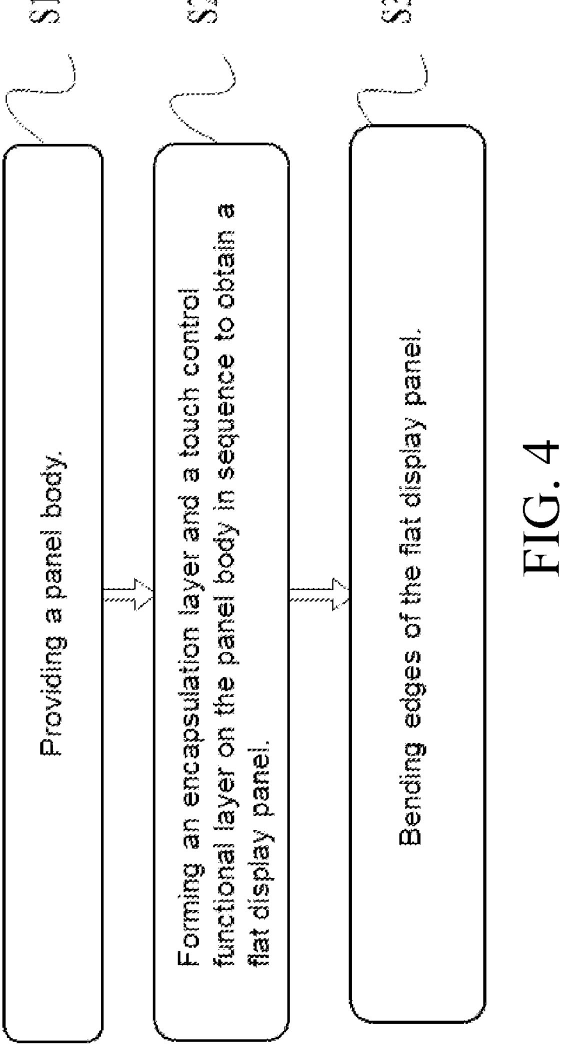
FIG. 4 is a flowchart of a manufacturing method of the curved display panel according to an embodiment of the present disclosure.

Next, referring to FIG. 4, FIG. 4 is a flowchart of a manufacturing method of the curved display panel according to an embodiment of the present disclosure. The manufacturing method includes following steps:

step S1: providing a panel body;

step S2: forming the encapsulation layer and the touch control functional layer on the panel body in sequence to obtain the flat display panel; and step S3: bending the edges of the flat display panel.

Wherein, specifically, the step S2 includes following steps:

manufacturing the first barrier layer on the panel body;

manufacturing the organic layer on the first barrier layer;

manufacturing the second barrier layer on the organic layer;

manufacturing the first interlayer insulating layer on the second barrier layer;

manufacturing the touch control electrode layer on the first interlayer insulating layer; and manufacturing the second interlayer insulating layer on the touch control electrode layer.

Wherein, at least one of the second barrier layer, the first interlayer insulating layer, or the second interlayer insulating layer is the composite film layer including the inorganic sublayers and the organic sublayers disposed alternatingly.

Wherein, specifically, the step S1 includes following steps:

providing the substrate;

manufacturing the thin film transistor array layer on the substrate; and manufacturing the light-emitting functional layer on the thin film transistor array layer.

It should be noted that the substrate may be the rigid substrate or the flexible substrate. If the substrate is the rigid substrate, the substrate needs to be peeled by laser before bending, and if the substrate is the flexible substrate, there is no need to be peeled. The thin film transistor array layer includes the plurality of thin film transistors and is configured to drive the light-emitting functional layer to work. The light-emitting functional layer includes the anode, the organic light-emitting layer, and the cathode. Wherein, the anode provides the holes, the cathode provides the electrons, and the holes and the electrons are composited in the organic light-emitting layer to emit light for displaying the corresponding pictures.

Wherein, the first barrier layer and the organic layer may be deposited by one of chemical vapor deposition process, atomic layer deposition process, or physical vapor deposition process.

Wherein, the materials of the first barrier layer and the inorganic sublayers are one of silicon nitride, silicon carbonitride, silicon oxynitride, silicon oxide, aluminum oxide, or zinc oxide. The materials of the organic layer and the organic sublayers are one of hexamethyldisiloxane, acrylic salts, polyacrylate, polycarbonate, or polystyrene.

Wherein, a deposition method of the inorganic sublayers and the organic sublayers may be the chemical vapor deposition process or the atomic layer deposition process.

Wherein, the composite film layer includes the N inorganic sublayers and the N−1 organic sublayers, and each of the N−1 organic sublayers is disposed between the two adjacent inorganic sublayers. Wherein, N is the integer greater than 1. When the composite film layer includes the plurality of organic sublayers, the composite film layer is still formed by alternatingly depositing the inorganic sublayers and the organic sublayers in sequence from bottom to top according to the order of one inorganic sublayer, one organic sublayer, another one inorganic sublayer, another one organic sublayer, etc. The thickness of the inorganic sublayers is greater than or equal to 10 nm and is less than 1 μm. The thickness of the organic sublayers is greater than or equal to 10 nm and is less than 1 μm. The thickness of the composite film layer is greater than or equal to 100 nm and is less than or equal to 1 μm.

It can be understood that in the bending process, since the composite film layer is formed by alternatingly depositing the heterogeneous films, when the topmost inorganic sublayer is broken, the organic sublayers can prevent the cracks from extending, and the cracks will not extend to the lowest inorganic sublayer. Therefore, reliability of encapsulation can be ensured.

In an embodiment, the steps of manufacturing the first interlayer insulating layer on the second barrier layer and manufacturing the touch control electrode layer on the first interlayer insulating layer may be combined to be one step: manufacturing the touch control electrode layer on the second barrier layer. It can be understood that this embodiment omits the first interlayer insulating layer by directly manufacturing the touch control electrode layer on the side surface of the second barrier layer away from the organic layer, thereby reducing the thickness of the curved display panel, reducing one manufacturing process, and saving the production costs.

An embodiment of the present disclosure further provides a display device, which includes the curved display panel mentioned above and a coverplate disposed on the curved display panel. A structure of the curved display panel and the manufacturing method thereof may refer to the related descriptions in FIGS. 1 to 4 and will not be iterated herein for the sake of conciseness. The display device provided in this embodiment of the present disclosure may be a product or component having a display function, such as a mobile phone, a tablet computer, a notebook computer, a digital camera, a navigator, etc.

In summary, the curved display panel provided by the embodiments of the present disclosure includes the encapsulation layer and the touch control functional layer disposed on the side surface of the encapsulation layer. The encapsulation layer includes the first barrier layer, the organic layer, and the second barrier layer disposed in the stack, and the touch control functional layer includes the first interlayer insulating layer disposed on the side surface of the second barrier layer away from the organic layer, and the touch control electrode layer and the second interlayer insulating layer disposed in the stack on the side surface of the first interlayer insulating layer away from the second barrier layer. Wherein, at least one of the second barrier layer, the first interlayer insulating layer, or the second interlayer insulating layer is the composite film layer including the inorganic sublayers and the organic sublayers disposed alternatingly. The present disclosure replaces at least one of the second barrier layer, the first interlayer insulating layer, or the second interlayer insulating layer with the composite film layer that is formed by alternatingly depositing the heterogeneous films. In one aspect, the organic sublayers can fill pores and holes of the inorganic sublayers to improve the water blocking properties. In another aspect, during a three-dimensional bonding process, since the composite film layer is formed by alternatingly depositing the heterogeneous films, when the topmost inorganic sublayer is broken, the organic sublayers can prevent the cracks from extending, and the cracks will not extend to the lowest inorganic sublayer. Therefore, the encapsulation failure caused by breakage of the inorganic layers can be prevented, thereby improving the product yields. The present disclosure can solve following technical problems: the inorganic layers away from the light-emitting material, the first interlayer insulating layer, and the second interlayer insulating layer are prone to breaking when the encapsulation layer and the touch control functional layer of the curved display panel in current technology are in the bending process, thereby causing encapsulation to fail and seriously affecting the encapsulation yields.

In the above embodiments, the description of each embodiment has its own emphasis. For the parts that are not described in detail in an embodiment, can refer to the detailed description of other embodiments above.

It can be understood that for a person of ordinary skill in the art, equivalent replacements or changes can be made according to the technical solution of the present disclosure and its inventive concept, and all these replacements or changes should fall within the protection scope of the claims attached to the present disclosure.

What is claimed is:

1. A curved display panel, comprising an encapsulation layer and a touch control functional layer disposed on one side surface of the encapsulation layer;

wherein the encapsulation layer comprises a first barrier layer, an organic layer, and a second barrier layer disposed in a stack, and the touch control functional layer comprises a first interlayer insulating layer disposed on one side surface of the second barrier layer away from the organic layer, and a touch control electrode layer and a second interlayer insulating layer disposed in a stack on one side surface of the first interlayer insulating layer away from the second barrier layer; and wherein at least one of the second barrier layer, the first interlayer insulating layer, or the second interlayer insulating layer is a composite film layer comprising inorganic sublayers and organic sublayers disposed alternatingly.

2. The curved display panel according to claim 1, wherein the composite film layer comprises N inorganic sublayers and N−1 organic sublayers, and each of the N−1 organic sublayers is disposed between two adjacent inorganic sublayers, wherein N is an integer greater than 1.

3. The curved display panel according to claim 2, wherein the N inorganic sublayers comprise N−1 first inorganic sublayers disposed in a stack and a second inorganic sublayer disposed on the N−1 first inorganic sublayers, and each of the first inorganic sublayers is defined with a plurality of grooves on one side away from the organic layer.

4. The curved display panel according to claim 3, wherein N is an integer greater than 2, and projections of the grooves of two adjacent first inorganic sublayers on the organic layer are staggered from each other.

5. The curved display panel according to claim 1, wherein materials of the first barrier layer and the inorganic sublayers are one of silicon nitride, silicon carbonitride, silicon oxynitride, silicon oxide, aluminum oxide, or zinc oxide.

6. The curved display panel according to claim 1, wherein materials of the organic layer and the organic sublayers are one of hexamethyldisiloxane, acrylic salts, polyacrylate, polycarbonate, or polystyrene.

7. The curved display panel according to claim 1, wherein a thickness of the inorganic sublayers is greater than or equal to 10 nm and is less than 1 μm.

8. The curved display panel according to claim 1, wherein a thickness of the organic sublayers is greater than or equal to 10 nm and is less than 1 μm.

9. The curved display panel according to claim 1, wherein a thickness of the composite film layer is greater than or equal to 100 nm and is less than or equal to 1 μm.

10. A manufacturing method of a curved display panel, comprising following steps:

step S1: providing a panel body;

step S2: forming an encapsulation layer and a touch control functional layer on the panel body in sequence to obtain a flat display panel; and step S3: bending edges of the flat display panel;

wherein the step S2 comprises following steps:

manufacturing a first barrier layer on the panel body;

manufacturing an organic layer on the first barrier layer;

manufacturing a second barrier layer on the organic layer;

manufacturing a first interlayer insulating layer on the second barrier layer;

manufacturing a touch control electrode layer on the first interlayer insulating layer; and manufacturing a second interlayer insulating layer on the touch control electrode layer;

wherein at least one of the second barrier layer, the first interlayer insulating layer, or the second interlayer insulating layer is a composite film layer comprising inorganic sublayers and organic sublayers disposed alternatingly.

11. The manufacturing method of the curved display panel according to claim 10, wherein materials of the first barrier layer and the inorganic sublayers are one of silicon nitride, silicon carbonitride, silicon oxynitride, silicon oxide, aluminum oxide, or zinc oxide.

12. The manufacturing method of the curved display panel according to claim 10, wherein materials of the organic layer and the organic sublayers are one of hexamethyldisiloxane, acrylic salts, polyacrylate, polycarbonate, or polystyrene.

13. The manufacturing method of the curved display panel according to claim 10, wherein a thickness of the inorganic sublayers is greater than or equal to 10 nm and is less than 1 μm.

14. The manufacturing method of the curved display panel according to claim 10, wherein a thickness of the organic sublayers is greater than or equal to 10 nm and is less than 1 μm.

15. The manufacturing method of the curved display panel according to claim 10, wherein a thickness of the composite film layer is greater than or equal to 100 nm and is less than or equal to 1 μm.

16. A display device, comprising a curved display panel and a coverplate disposed on the curved display panel; wherein the curved display panel comprises an encapsulation layer and a touch control functional layer disposed on one side surface of the encapsulation layer;

the encapsulation layer comprises a first barrier layer, an organic layer, and a second barrier layer disposed in a stack, and the touch control functional layer comprises a first interlayer insulating layer disposed on one side surface of the second barrier layer away from the organic layer, and a touch control electrode layer and a second interlayer insulating layer disposed in a stack on one side surface of the first interlayer insulating layer away from the second barrier layer; and at least one of the second barrier layer, the first interlayer insulating layer, or the second interlayer insulating layer is a composite film layer comprising inorganic sublayers and organic sublayers disposed alternatingly.

17. The display device according to claim 16, wherein materials of the first barrier layer and the inorganic sublayers are one of silicon nitride, silicon carbonitride, silicon oxynitride, silicon oxide, aluminum oxide, or zinc oxide.

18. The display device according to claim 16, wherein materials of the organic layer and the organic sublayers are one of hexamethyldisiloxane, acrylic salts, polyacrylate, polycarbonate, or polystyrene.

19. The display device according to claim 16, wherein a thickness of the inorganic sublayers is greater than or equal to 10 nm and is less than 1 μm.

20. The display device according to claim 16, wherein a thickness of the organic sublayers is greater than or equal to 10 nm and is less than 1 μm.

* * * * *